United States Patent
Gambino et al.

(10) Patent No.: US 10,163,673 B2
(45) Date of Patent: Dec. 25, 2018

(54) DUAL ADHESIVE BONDING WITH PERFORATED WAFER

(71) Applicant: GLOBALFOUNDRIES INC., Grand Cayman (KY)

(72) Inventors: Jeffrey P. Gambino, Westford, VT (US); Kenneth F. McAvey, Jr., Winooski, VT (US); Charles F. Musante, Burlington, VT (US); Anthony K. Stamper, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 1130 days.

(21) Appl. No.: 14/047,237

(22) Filed: Oct. 7, 2013

(65) Prior Publication Data

US 2015/0096673 A1    Apr. 9, 2015

(51) Int. Cl.
*H01L 21/673* (2006.01)
*H01L 21/683* (2006.01)

(52) U.S. Cl.
CPC .. *H01L 21/6835* (2013.01); *H01L 2221/6834* (2013.01); *H01L 2221/68318* (2013.01); *H01L 2221/68327* (2013.01); *H01L 2221/68381* (2013.01); *Y10T 428/24942* (2015.01)

(58) Field of Classification Search
CPC . H01L 2221/68318; H01L 2221/68327; H01L 2221/6834; H01L 2221/68381; H01L 21/6835; Y10T 428/24942
See application file for complete search history.

(56) References Cited

U.S. PATENT DOCUMENTS

| 5,856,387 | A | 1/1999 | Sasaki et al. |
| 5,885,135 | A | 3/1999 | Desorcie et al. |
| 6,171,513 | B1 | 1/2001 | Davis et al. |
| 6,228,452 | B1 | 5/2001 | Oka et al. |
| 7,078,320 | B2 | 7/2006 | Hsu et al. |

(Continued)

FOREIGN PATENT DOCUMENTS

| JP | 06291236 | 10/1994 |
| JP | 10086303 | 4/1998 |

(Continued)

OTHER PUBLICATIONS

David J. Mould, A new Alternative for Temporary Wafer Mounting, Apr. 8, 2002.*

(Continued)

*Primary Examiner* — Vishal I Patel
(74) *Attorney, Agent, or Firm* — David Cain; Hoffman Warnick LLC

(57) ABSTRACT

The embodiments of the present invention relate to semiconductor device manufacturing, and more particularly, a method of temporarily bonding a semiconductor wafer to a wafer carrier with a multi-layered contact layer as well as a structure. A method is disclosed that includes: forming a first layer on a surface of a semiconductor wafer; forming a second layer on the first layer; bonding a perforated carrier to the second layer; and removing the semiconductor wafer from the perforated carrier. The first layer may be composed of an adhesive. The second layer may be composed of a material having a higher outgassing temperature than the first layer.

17 Claims, 7 Drawing Sheets

(56) References Cited

U.S. PATENT DOCUMENTS

| | | | |
|---|---|---|---|
| 7,285,321 | B2 | 10/2007 | Kanakarajan et al. |
| 7,541,203 | B1 | 6/2009 | Knickerbocker |
| 2005/0100719 | A1 | 5/2005 | Kanakarajan et al. |
| 2008/0014439 | A1* | 1/2008 | Bol .................... H01L 21/6835 428/337 |
| 2011/0018127 | A1* | 1/2011 | Lee ........................... C09J 7/00 257/729 |

FOREIGN PATENT DOCUMENTS

| | | |
|---|---|---|
| JP | 2001279197 | 10/2001 |
| JP | 2004031757 | 1/2004 |

OTHER PUBLICATIONS

Zoschke et al., "Polyimide based Temporary Wafer Bonding Technology for High Temperature Compliant TSV Backside Processing and Thin Device Handling"., SUSS MicroTec, pp. 1-10., http://www.suss.com/fileadmin/user_upload/technical_publications/WP_PolymideBasedTemporaryWaferBondingTechnology_2012_V1.pdf.

Eric Beyne, "Requirements, Challenges and Current Status of Thin Wafer Carrier Systems for 3D TSV Thinning and Backside Processing"., 3DS-IC Manufacturing—From Concept to Commercialization Jul. 12, 2011, San Francisco Marriott Marquis Hotel, Semi International Standards, IMEC 2011,pp. 1-41, http://www.semiconwest.org/sites/semiconwest.org/files/file_attach/110712_Semicon_Standards_IMEC_HO.pdf.

Markus Wimplinger, "Temporary Bonding-HVM Concerns"., "Enabling 3D: Temporary Bonding Workshop" by Sematech, Jul. 11, 2011, EV Group. http://www.sematech.org/meetings/archives/3d/10161/pres/WIM110711- Sematech%20Enabling%203D%20Workshop%20-%20Presentation_01.pdf.

Mould et al., "A New Alternative for Temporary Wafer Mounting"., GaAs MANTECH Conference, Backside Processing Apr. 8-11, 2002 Proceedings, pp. 109-112, DAETEC, http://www.daetec.com/pdf/alternative-temporary-wafer-mounting.pdf.

* cited by examiner

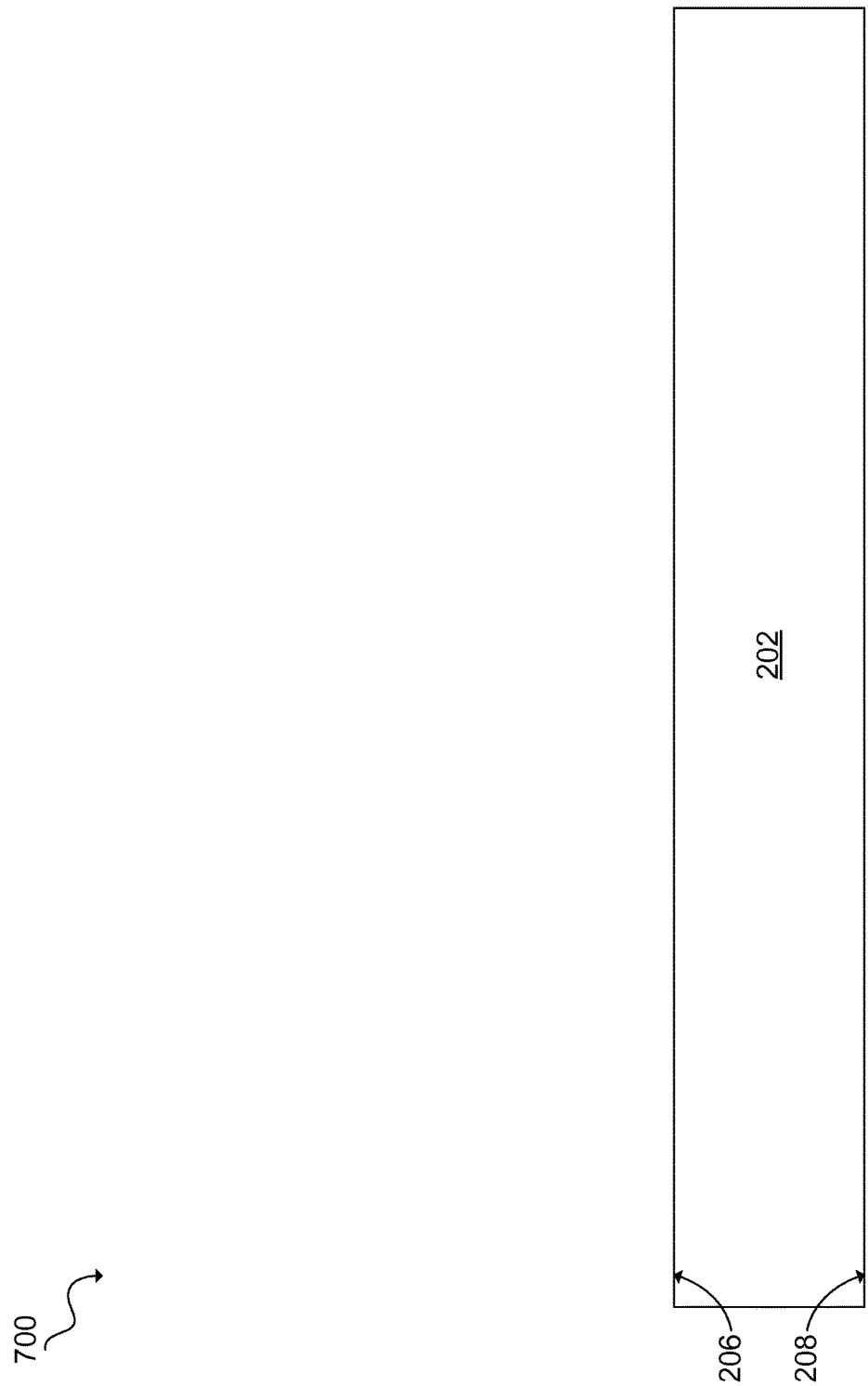

US 10,163,673 B2

DUAL ADHESIVE BONDING WITH PERFORATED WAFER

BACKGROUND

The present invention relates generally to semiconductor device manufacturing, and more particularly, to temporarily adhering a semiconductor wafer to a wafer carrier to secure it during processing steps such as backside grinding, metallization, and chip dicing.

Integrated circuits are typically made by manufacturing semiconductor wafers. Each semiconductor wafer is typically 100 mm, 125 mm, 150 mm, 200 mm, or 300 mm in diameter and can be approximately several hundred microns thick. In some instances, the semiconductor wafer may have to be thinned in order to reveal through-wafer vias ("TWVs") for subsequent processing and testing steps. When semiconductor wafers are thinned to a thickness of less than about 150 µm, the semiconductor wafer is usually temporarily attached to a wafer carrier, also known as a handle wafer, in order to secure it during manufacture. Once secured, the exposed side (i.e., "backside") of the semiconductor wafer may be processed using techniques such as grinding, chemical mechanical planarization (CMP), and cleaning. The backside of the semiconductor wafer may then be subjected to a metallization process in which metals such as titanium, chromium, copper, gold, and combinations thereof are deposited. The metallization process usually takes place by sputter deposition in a high vacuum sputter deposition tool chamber. When manufacture and processing of the wafer is completed, chips or die are cut or "diced" from the wafer and may later be mounted into a single chip package or multiple chip package for implementation in a printed circuit board or other applications.

Typically, the semiconductor wafer is attached to the wafer carrier using an adhesive that is coated and cured on the semiconductor wafer. Typically, the adhesive is deposited on a surface of the semiconductor wafer that is not being processed (i.e., "front side"). The wafer carrier, typically a silicon wafer or a glass carrier, is then placed in contact with the adhesive on the front side of the wafer and allowed to bond. Perforated wafer carriers have been increasingly used because they provide more surface area for adhesion than solid carriers and allow for relatively easy de-bonding by providing holes for solvents to contact and dissolve the adhesive.

However, temperatures at which the semiconductor wafers are typically processed may have an adverse affect on commonly used adhesives. During conventional metallization processes, temperatures in the metal deposition tool chamber, as well as on the semiconductor wafer itself, may exceed the temperature at which commonly used adhesives begin to outgas volatile organic compounds ("VOCs"). The temperature at which outgassing occurs may be referred to as the outgas sing temperature ("$T_g$"). The outgas sing of VOCs and the subsequent condensation of adhesive droplets may cause poor adhesion of the metal to the backside of the semiconductor wafer, resulting in peeling of the metal layer and poor adhesion. In addition, the outgas sing VOCs may result in the contamination of the process chamber. Accordingly, it may be desirable to overcome the deficiencies and limitations described hereinabove.

SUMMARY

According to one embodiment of the present invention, a method is disclosed. The method may include: forming a multi-layered contact layer on a surface of a semiconductor wafer. The multi-layered contact layer may include a first layer on the surface of the semiconductor wafer, and a second layer covering the first layer. The second layer may be composed of a material having a higher outgassing temperature than the first layer.

According to another embodiment of the present invention, a method is disclosed. The method may include: forming a first layer on a surface of a semiconductor wafer; forming a second layer on the first layer; bonding a perforated carrier to the second layer; and removing the semiconductor wafer from the perforated carrier. The first layer may be composed of an adhesive. The second layer may be composed of a material having a higher outgassing temperature than the first layer. The perforated carrier is may be composed of one or more holes extending through the enter thickness of the perforated carrier.

According to another embodiment of the present invention, a structure is disclosed. The structure may include: a multi-layered contact layer on a surface of a semiconductor wafer. The multi-layered contact layer may include a first layer in contact with the surface of the semiconductor wafer and a second layer on the first layer. The second layer may have a higher outgas sing temperature than the first layer.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

FIG. 7 is a cross sectional view illustrating the second step of the multi-step de-bonding process, according to an embodiment of the present invention.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
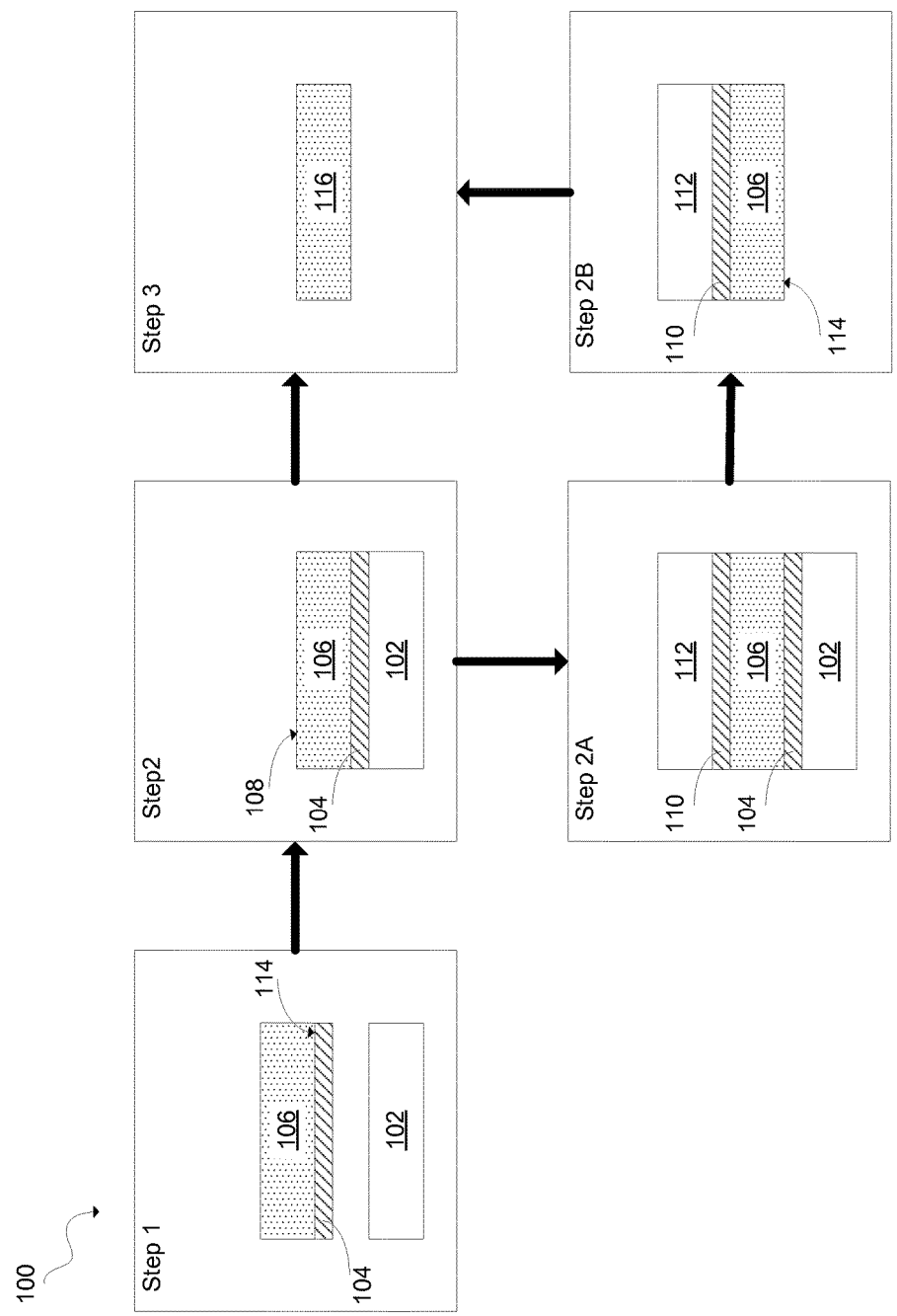
FIG. 1 is a cross sectional view illustrating a typical generalized work flow for two methods of semiconductor wafer processing and chip manufacture, by way of reference.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath," "below," or "under" another element, it can be directly beneath or under the other element, or intervening elements may be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The embodiments of the present invention relate to semiconductor device manufacturing, and more particularly, temporarily bonding a semiconductor wafer to a wafer carrier with a multi-layered contact layer in order to secure it during processing steps such as backside grinding, metallization, and chip dicing. A flow diagram depicting the generalized work flow for two methods of semiconductor wafer processing is described in detail below with reference to FIG. 1. Embodiments by which to reduce adhesive outgassing while preserving ease of removal of the wafer carrier is described in detail below with reference to the accompanying drawings FIGS. 2-7.

Referring now to FIG. 1, a flow diagram 100 illustrates a typical generalized work flow for two methods of semiconductor wafer processing and chip manufacture. Step 1 illustrates temporarily bonding a front side 114 of a semiconductor wafer 106 to a first wafer carrier 102 with a front side adhesive layer 104. Step 2 illustrates processing a back side 108 of the semiconductor wafer 106. Step 2A is an optional step in which the semiconductor wafer 106 may be transferred to a second wafer carrier 112 with a back side adhesive layer 110. The back side adhesive layer 110 may be composed of the same, or different, material as the front side adhesive layer 104. Typically both the front side adhesive layer 104 and the back side adhesive layer 110 may both have a uniform composition (i.e., each adhesive layer is composed of one type of adhesive). Step 2B illustrates de-bonding the semiconductor wafer 106 from the first wafer carrier 102 and processing the front side 114 of the semiconductor wafer 106. Step 3 shows a processed semiconductor wafer 116 either after the semiconductor wafer 106 is de-bonded from the first wafer carrier 102 subsequent to Step 2, or after the semiconductor wafer 106 is de-bonded from the second wafer carrier 112 subsequent to Step 2B.

Figure 2:
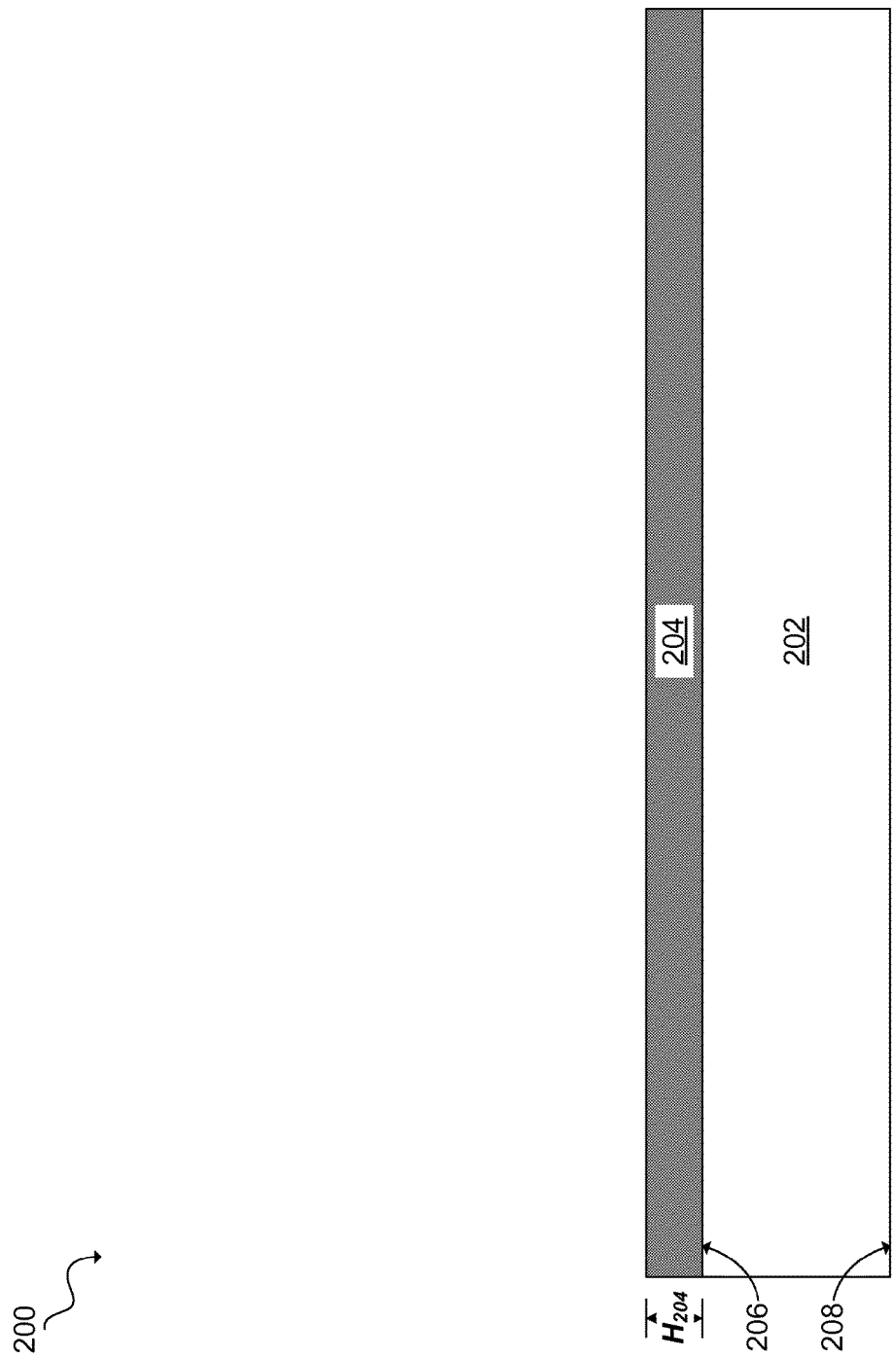
FIG. 2 is a cross sectional view illustrating depositing a first layer on a front side surface of a semiconductor wafer, according to an embodiment of the present invention.

Referring now to FIG. 2, a structure 200 is shown. FIG. 2 illustrates depositing a first layer 204 on a front side 206 surface of a semiconductor wafer 202 (hereinafter "wafer"). The wafer 202 may have a back side 208 surface that remains exposed. The wafer 202 may include a typical wafer known in the art of which may include multiple layers and materials. The multiple layers may consist of semiconductor materials, dielectric materials, and conductive materials. The semiconductor materials may include any semiconductor materials well known in the art, such as, for example, undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. Non-limiting examples of compound semiconductor materials include gallium arsenide, indium arsenide, and indium phosphide. Typically the wafer 202 may be about, but is not limited to, several hundred microns thick. The wafer 202 may have a diameter of typical wafers commonly used in the art, such as, but not limited to, 100 mm, 125 mm, 150 mm, 200 mm, or 300 mm.

In one embodiment, the first layer 204 may be composed of any commercially available adhesive having an outgassing temperature ranging from approximately 100° C. to approximately 300° C. Adhesives that may be used to form the first layer 204 include, but are not limited to hydrocarbon adhesives commonly applied to semiconductor wafers. The first layer 204 may have a height $H_{204}$ ranging from approximately 2 μm to approximately 20 μm.

The first layer 204 may be deposited on the front side 206 of the wafer 202 using conventional deposition techniques such as, for example, chemical vapor deposition (CVD), thermal CVD (THCVD), sputtering, or spin-on deposition. In an embodiment in which spin-on deposition is used, the first layer 204 may be deposited in one or more coats. Application of the first coat may begin while the wafer 202 is stationary. The wafer 202 may then be accelerated to provide an even coat. In one embodiment, the wafer 202 may be accelerated to a spin speed ranging from approximately 1000 rpm to approximately 5000 rpm. Additional layers may be deposited in a similar fashion. After the first layer 204 is deposited, a curing process may be performed.

Figure 3:
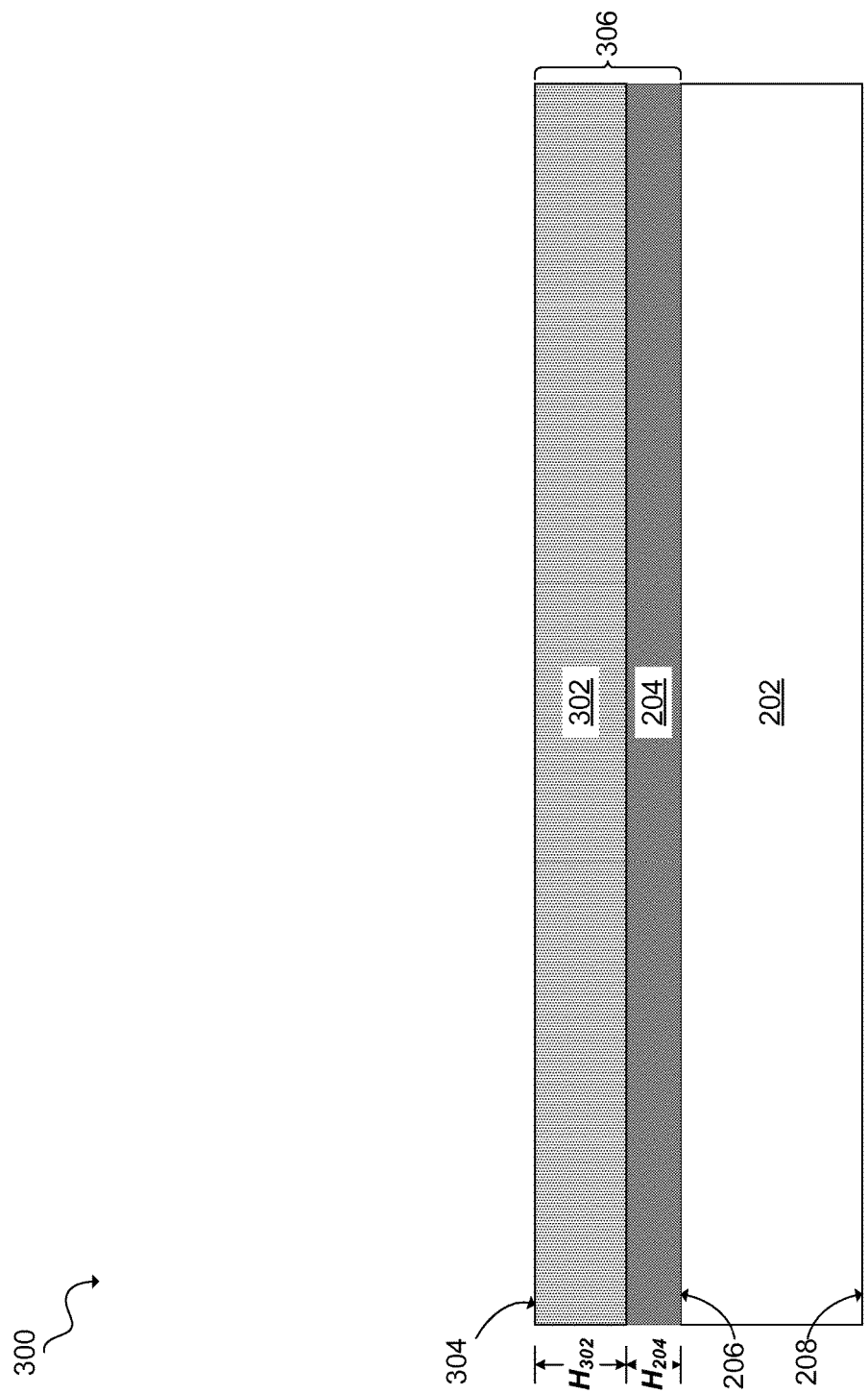
FIG. 3 is a cross sectional view illustrating forming a second layer over the first layer to form a contact layer, according to an embodiment of the present invention.

Referring now to FIG. 3, a structure 300 is shown. FIG. 3 illustrates forming a second layer 302 over the first layer 204. The combination of the first layer 204 and the second layer 302 may be referred to as a contact layer 306. The second layer 302 may be formed using similar techniques as those used to form the first layer 204 as described above with reference to FIG. 2. After it is formed, the second layer 302 may completely cover the first layer 204 so that no portions of the first layer 204 may be exposed. In one embodiment, the second layer 302 may cover not only a top surface of the first layer 204, but also a side or all sides of the first layer 204.

In one embodiment, the second layer 302 may be composed of any commercially available adhesive, preferably having a high outgassing temperature. It is contemplated that the chosen adhesive used to form the second layer 302 may have an outgassing temperature ranging from approximately 200° C. to approximately 400° C. In one embodiment, the second layer 302 may be composed of an adhesive having a concentration of propylene glycol monomethyl-ether acetate ("PGMEA") above approximately 90%. The adhesive used to form the second layer 204 may have a formulation allowing it to be dissolved in the same solvent as the first layer 204.

In another embodiment, the second layer 302 may be composed entirely of a dummy material. The dummy material may include, but is not limited to: a silicon oxide, spin-on glass (SOG), or a conventional polymide known in the art. In an embodiment in which the second layer 302 is composed of a silicon oxide, the second layer 302 may be formed using a low-temperature thermal CVD ("THCVD") process. In an embodiment in which the second layer 302 is composed of SOG or a conventional polymide, the second layer 302 may be formed using a spin-on application process similar to the techniques used to form the first layer 204 as described above in reference to FIG. 2. The second layer 302 may have an upper surface 304 and a height $H_{302}$ ranging from approximately 1 µm to approximately 10 µm.

Figure 4:
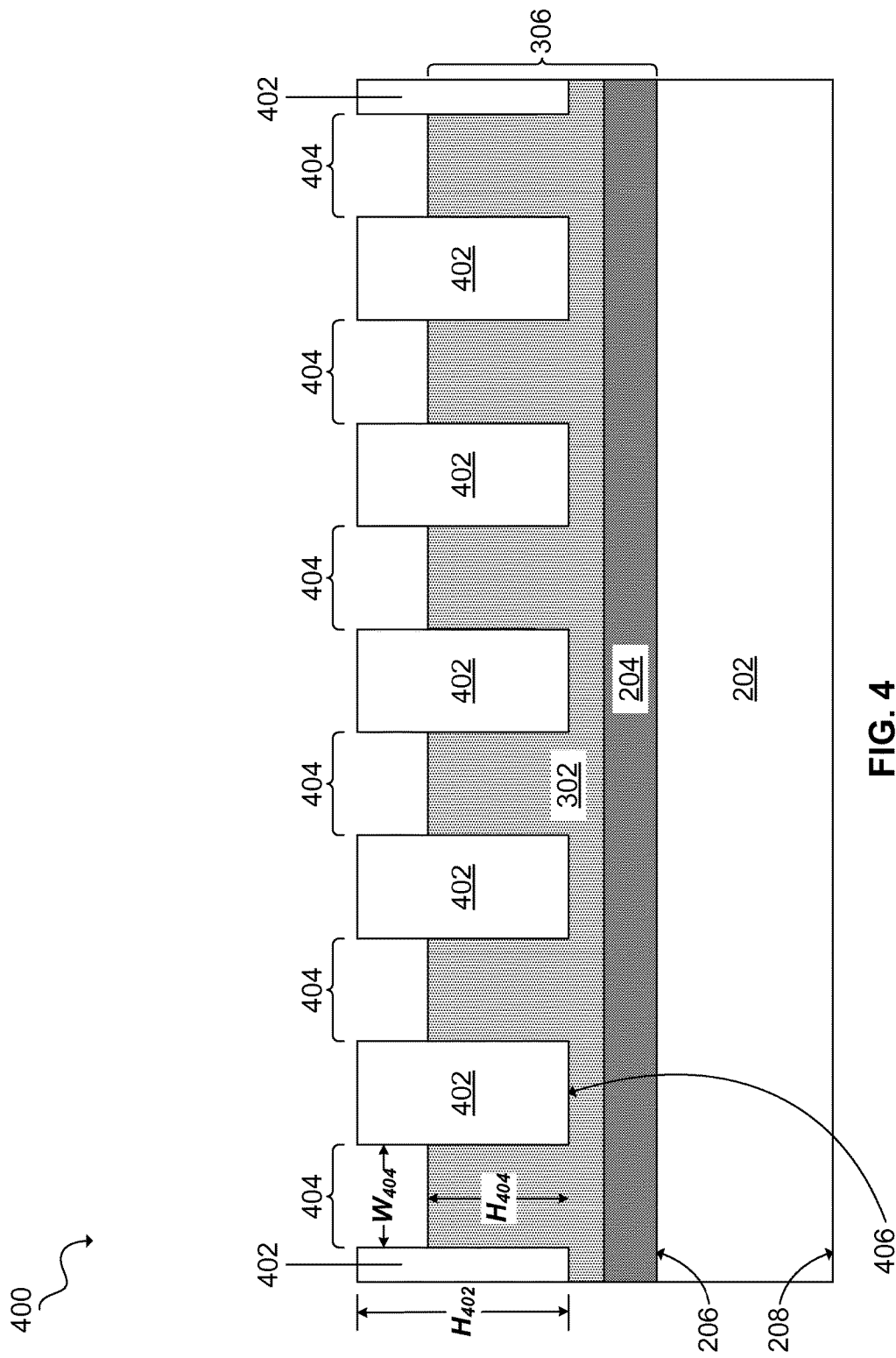
FIG. 4 is a cross sectional view illustrating bonding the wafer to a perforated wafer carrier, according to an embodiment of the present invention.

Referring now to FIG. 4, a structure 400 is shown. FIG. 4 illustrates bonding the wafer 202 to a perforated wafer carrier 402 (hereinafter "perforated carrier") by bringing the upper surface 304 (FIG. 3) of the second layer 302 in contact with an upper surface 406 of the perforated carrier 402. The perforated carrier 402 may have carrier holes 404 (hereinafter "holes). The holes 404 may increase the surface area available for adhesion by allowing some portion of the second layer 302 to be displaced within the holes 404 during the bonding process, as described in more detail below. The holes 404 may also facilitate de-bonding by allowing solvents and etchants to reach the contact layer 306, and more specifically, the second layer 302, through the holes 404, also described in more detail below. The perforated carrier 402 may be composed of any commonly used material known in the art, such as for example, glass, sapphire, or ceramic. The perforated carrier 402 may have a height $H_{402}$ ranging from approximately 500 µm to approximately 900 µm and an overall diameter that corresponds to the diameter of the wafer 202. In one embodiment, the holes 404 may have a width $W_{404}$ ranging from approximately 200 µm to approximately 400 µm.

The wafer 202 may be bonded to the perforated carrier 402 using a conventional wafer bonding techniques and tools, such as, for example, a thermal compression tool, or a fully automated wafer bonder, that presses the upper surface 304 (FIG. 3) of the second layer 302 against an upper surface 406 of the perforated carrier 402 at a determined temperature range, pressure range, and time to allow the second layer 302 to bond with the perforated carrier 402. The bonding process may be conducted in a chamber at a temperature ranging from approximately 20° C. to approximately 300° C., a pressure ranging from approximately 1 microTorr to approximately 760 Torr, and for a time of approximately 1 min to approximately 30 min.

In one embodiment, a portion of the second layer 302 may displace and migrate into the holes 404 by a height $H_{404}$ during the bonding process. The extent of migration into the holes 404 is a function of the thickness and viscosity of the second layer 302. Therefore, height $H_{404}$ may range from approximately 1% to approximately 100% of the height $H_{402}$ of the perforated carrier 402. It is noted that embodiments are considered in which the height $H_{404}$ may be uniform across each of the holes 404 or may vary in each of the holes 404. In another embodiment, the second layer 302 may neither displace nor migrate into the holes 404 and no portion of the second layer 302 may extend past or above the upper surface 406 of the perforated carrier 402. Portions of the upper surface 304 of the second layer 302 may remain exposed by the holes 404. After the wafer 202 is bonded to the perforated carrier 402, the back side 208 of the wafer 202 may be processed using techniques such as grinding, CMP, cleaning, metallization, dicing, and electrical testing.

Figure 5:
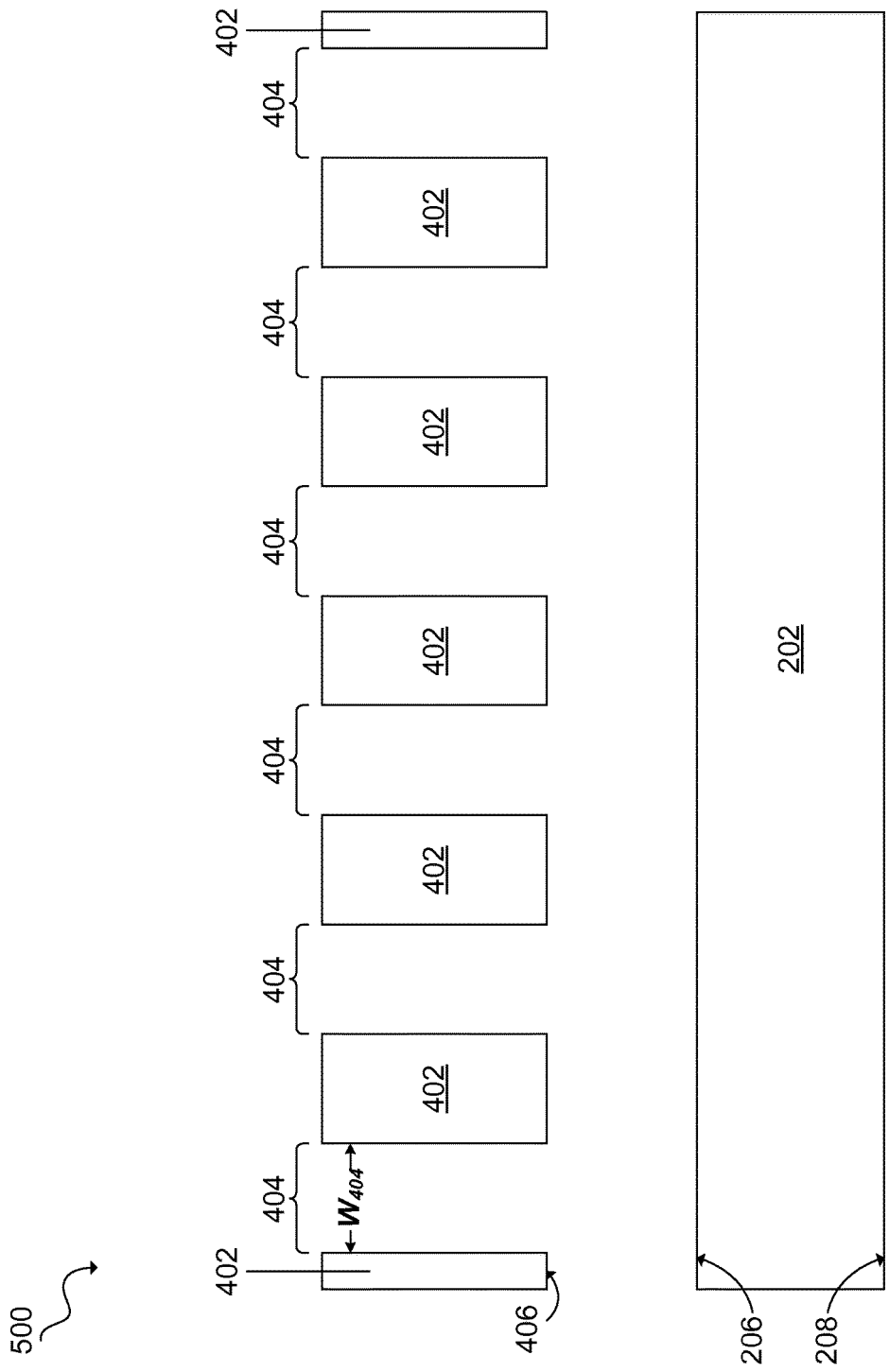
FIG. 5 is a cross sectional view illustrating de-bonding the wafer from the perforated wafer carrier in an embodiment in which the contact layer is composed of two layers of adhesives.

Referring now to FIG. 5, a structure 500 is shown. FIG. 5 illustrates de-bonding the wafer 202 from the perforated carrier 402 in an embodiment in which the contact layer 306 (FIG. 4) is composed of two layers of adhesives. The de-bonding process may be conducted by dissolving both the first layer 206 (FIG. 4) and the second the layer 302 (FIG. 4) in one or more solvents using one or more steps. Solvents that may be used to dissolve the first layer 204 (FIG. 4) and the second layer 302 (FIG. 4), include, but are not limited to PGMEA, isopropyl alcohol (IPA), acetone, methyl ethyl ketone (MEK), methanol, and various acids and bases. In one embodiment, the solvent used may dissolve the first layer 204 (FIG. 4) at a faster rate than it dissolves the second layer 302 (FIG. 4). In another embodiment, structure 400 (FIG. 4) may be immersed in a tank with a tempered solvent. The temperature of the solvent may range from approximately 20° C. to approximately 200° C., and the structure 400 (FIG. 4) may be submersed for a time of approximately 10 s to approximately 30 min. After the wafer 202 is released from the perforated carrier 402, the wafer 202 and the perforated carrier 402 may undergo additional clean and rinse processes to remove any residual solvent and/or adhesive. The wafer 202 may then be removed and processed further. The perforated carrier 402 may be reused and bonded to another semiconductor wafer.

In an embodiment in which the contact layer 306 (FIG. 4) is composed of an adhesive layer and a dummy material layer (i.e., the second layer 302 (FIG. 4) is composed entirely of a dummy material), a multi-step de-bonding process may be used to remove the wafer 202 (FIG. 4) from the perforated carrier 402. This multi-step de-bonding process is described in detail below with reference to FIGS. 6-7.

Figure 6:
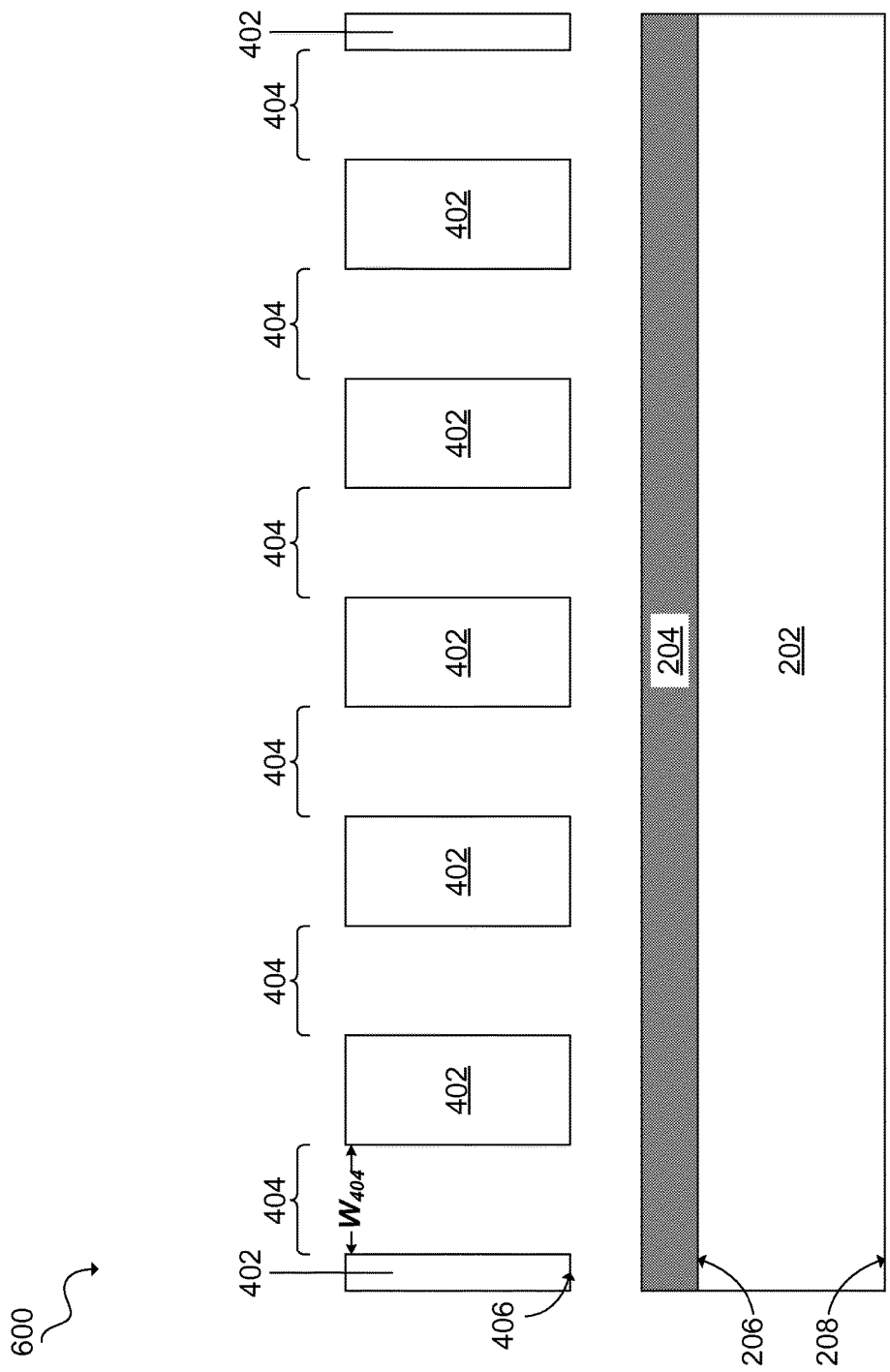
FIG. 6 is a cross sectional view illustrating the first step in the multi-step de-bonding process in which the wafer and the first layer may be separated from the perforated wafer carrier, according to an embodiment of the present invention.

Referring now to FIG. 6, a structure 600 is shown. FIG. 6 illustrates the first step in the multi-step de-bonding process in which the wafer 202 and the first layer 204 may be separated from the perforated carrier 402. During the first step, the second layer 302 (FIG. 4) may be removed from both the perforated carried 402 and the first layer 204. The second layer 302 (FIG. 4) may be removed, generally, by etching or dissolving the exposed portions of the upper surface 304 (FIG. 4) through the holes 404. The removal process may continue until substantially all of the second layer 302 (FIG. 4) is removed from both the perforated carrier 402 and the first layer 204. In an embodiment in which the second layer 302 (FIG. 4) is composed of a silicon oxide or a SOG, an HF etch may be performed to remove the second layer 302 (FIG. 4). In an embodiment in which the second layer 302 (FIG. 4) is composed of a polymide, n-methylpyrrolidine (NMP) may be used to remove the second layer 302 (FIG. 4). After the second layer 302 (FIG. 4) is removed, the perforated carrier 402 may be transferred to another chamber to undergo additional clean and rinse processes to remove any residual solvent and/or dummy material before it is reused. The de-bonding process may be continued in a subsequent step in which the first layer 204 is removed from the wafer 202.

Referring now to FIG. 7, a structure 700 is shown. FIG. 7 illustrates the second step of the multi-step de-bonding process. During the second step, the first layer 204 (FIG. 6) may be removed from the wafer 202 using similar dissolution techniques as those used to remove the first layer 204 (FIG. 4) and second layer 302 (FIG. 4) as described above with reference to FIG. 5. Additional clean and rinse processes may be performed on the wafer 202 to remove any residual adhesive and/or solvent. The wafer 202 may then be transferred to other chambers for further processing steps.

As described above, perforated carriers, like the perforated carrier 402 (FIG. 4), may preferable for use in bonding to semiconductor wafers because the holes 404 (FIG. 4) provide increased surface area for adhesion as well as allow for dissolution solvents and etchants to easily reach the contact layer 306 (FIG. 4) between the plate and the wafer. Despite these advantages, however, perforated carriers may also expose more of the adhesive to the chamber environment, leading to increased outgas sing of VOCs.

Embodiments of the present invention may eliminate or reduce the outgassing and contamination concerns as described above. More specifically, using a multilayered contact layer 306 (FIG. 3) in which each layer has a different outgassing temperature may eliminate or reduce the detrimental affects caused by outgassing. In other words, the second layer 302 (FIG. 3) may have an outgassing temperature greater than the first layer 204 (FIG. 3) and greater than typical metallization temperatures (above approximately 200° C.) and may cover the first layer 204 (FIG. 3), preventing it from outgassing. In addition, a multilayered contact layer 306 (FIG. 3) may allow for the use of an adhesive having advantageous bonding and de-bonding properties for the first layer 204 (FIG. 3), even though it may have a low outgassing temperature, because it may be completely covered by the second layer 302 (FIG. 3). This may allow for a larger variety of choices of materials for the contact layer 306 (FIG. 3), all while reducing chamber contamination and improving metal adhesion during the metallization process.

The terminology used herein is for the purpose of describing particular embodiments only and is not intended to be limiting of the invention. As used herein, the singular forms "a," "an," and "the" are intended to include the plural forms as well, unless the context clearly indicates otherwise. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming a multi-layered contact layer on a surface of a semiconductor wafer, wherein the multi-layered contact layer is comprised of a first layer on the surface of the semiconductor wafer, and a second layer covering the first layer, and wherein the second layer is comprised of a material having a higher outgas sing temperature than the first layer.

2. The method of claim 1, further comprising:
   bonding the semiconductor wafer to a carrier; and removing the semiconductor wafer from the carrier.

3. The method of claim 2, wherein the carrier is a perforated carrier comprised of one or more holes that extend through the entire thickness of the perforated carrier.

4. The method of claim 1, wherein the first layer is comprised of an adhesive having an outgassing temperature ranging from approximately 100° C. to approximately 300° C. and wherein the second layer is comprised of an adhesive having an outgas sing temperature ranging from approximately 200° C. to approximately 400° C.

5. The method of claim 1, wherein the first layer is comprised of an adhesive having an outgassing temperature ranging from approximately 100° C. to approximately 300° C. and wherein the second layer is comprised of a dummy material having an outgassing temperature ranging from approximately 200° C. to approximately 400° C.

6. The method of claim 1, wherein the second layer is comprised of a silicon oxide, a spin-on glass or a polymide.

7. The method of claim 2, wherein the bonding the semiconductor wafer to the carrier comprises:
   placing the carrier on the second layer; and
   applying pressure in a direction substantially perpendicular to the surface of the
   semiconductor wafer causing the second layer to be physically joined to the carrier.

8. The method of claim 2, wherein the removing the semiconductor from the carries comprises:
   removing the first layer with a solvent; and
   removing the second layer with a solvent.

9. The method of claim 2, wherein the removing the semiconductor wafer from the carrier comprises:
   removing the first layer with a solvent; and
   removing the second layer from the carrier using an etching process.

10. A method comprising:
    forming a first layer on a surface of a semiconductor wafer, wherein the first layer is comprised of an adhesive;
    forming a second layer on the first layer, wherein the second layer is comprised of a material having a higher outgas sing temperature than the first layer;
    bonding a perforated carrier to the second layer, wherein the perforated carrier is comprised of one or more holes extending through the enter thickness of the perforated carrier; and
    removing the semiconductor wafer from the perforated carrier.

11. The method of claim 10, wherein the first layer is comprised of an adhesive having outgassing temperature ranging from approximately 100° C. to approximately 300° C.

12. The method of claim 10, wherein the second layer is comprised of an adhesive having an outgassing temperature ranging from approximately 200° C. to approximately 400° C.

13. The method of claim 10, wherein the second layer is comprised of a silicon oxide, a spin-on glass, or a polymide having an outgassing temperature ranging from approximately 200° C. to approximately 400° C.

14. The method of claim 10, wherein the bonding the perforated carrier to the second layer comprises:
    placing the perforated carrier on the second layer; and
    applying pressure in a direction substantially perpendicular to the surface of the semiconductor wafer causing the second layer to be physically joined to the perforated carrier.

15. A method comprising:
    forming a first layer on a surface of a semiconductor wafer, wherein the first layer is comprised of an adhesive;
    forming a second layer on the first layer, wherein the second layer is comprised of a material having a higher outgas sing temperature than the first layer;

placing a perforated carrier on the second layer, wherein the perforated carrier is comprised of one or more holes extending through the entire thickness of the perforated carrier;

applying pressure in a direction substantially perpendicular to the surface of the semiconductor wafer causing the second layer to be physically joined to the perforated carrier and causing a portion of the second layer to displace and migrate into the one or more holes in the perforated carrier; and removing the semiconductor wafer from the perforated carrier.

16. The method of claim 10, wherein the removing the semiconductor wafer from the perforated carrier comprises:
   removing the first layer with a solvent; and
   removing the second layer with a solvent.

17. The method of claim 10, wherein the removing the semiconductor wafer form the perforated carrier comprises:
   removing the first layer with a solvent;
   removing the second layer from the perforated carrier using an etching process.

* * * * *

UNITED STATES PATENT AND TRADEMARK OFFICE
CERTIFICATE OF CORRECTION

PATENT NO. : 10,163,673 B2
APPLICATION NO. : 14/047237
DATED : December 25, 2018
INVENTOR(S) : Jeffrey P. Gambino et al.

It is certified that error appears in the above-identified patent and that said Letters Patent is hereby corrected as shown below:

In the Claims

Claim 1, Line 58: "...of a material having a higher outgas sing..." should be changed to "...of a material having a higher outgassing..."

Claim 10, Line 35: "...outgas sing temperature than the first layer..." should be changed to "...outgassing temperature than the first layer..."

Claim 15, Line 67: "...outgas sing temperature than the first layer..." should be changed to "...outgassing temperature than the first layer..."

Signed and Sealed this
Twenty-sixth Day of March, 2019

Andrei Iancu
*Director of the United States Patent and Trademark Office*